(12) United States Patent
Mirkin et al.

(10) Patent No.: US 7,611,619 B2
(45) Date of Patent: Nov. 3, 2009

(54) ELECTROCHEMICAL MINIATURIZATION OF ORGANIC MICRO- AND NANOSTRUCTURES

(75) Inventors: Chad A. Mirkin, Wilmette, IL (US); Yi Zhang, Evanston, IL (US); Khalid Salaita, Evanston, IL (US)

(73) Assignee: Northwestern University, Evanston, IL (US)

( * ) Notice: Subject to any disclaimer, the term of this patent is extended or adjusted under 35 U.S.C. 154(b) by 978 days.

(21) Appl. No.: 10/520,554

(22) PCT Filed: Jul. 7, 2003

(86) PCT No.: PCT/US03/21220

§ 371 (c)(1),
(2), (4) Date: Sep. 14, 2005

(87) PCT Pub. No.: WO2004/005582

PCT Pub. Date: Jan. 15, 2004

(65) Prior Publication Data

US 2006/0081479 A1    Apr. 20, 2006

Related U.S. Application Data

(60) Provisional application No. 60/394,141, filed on Jul. 5, 2002.

(51) Int. Cl.
*C25F 3/00* (2006.01)
*C25F 1/00* (2006.01)
*C23C 22/82* (2006.01)

(52) U.S. Cl. .................. 205/640; 205/674; 205/688; 205/705

(58) Field of Classification Search .............. 205/640, 205/674

See application file for complete search history.

(56) References Cited

U.S. PATENT DOCUMENTS 5,885,753 A    3/1999   Crooks et al.
6,818,117 B2 * 11/2004  Ferguson et al. ............ 205/316

OTHER PUBLICATIONS

International Search Report for PCT/US003/21220, mailed Jan. 16, 2004, from the U.S. Patent Office.
Griffin et al, *J. Am. Chem. Soc.*, 95:197 (1973).
Ross et al., *Langmuir*, 9:632 (1993).
Walczak et al., *Langmuir*, 7:2687 (1991).
Weinberger et al., *'Adv. Mater.*, 12:1600 (2000).
Yang et al, *J. Elecroanal. Chem.*, 429:1 (1997).

* cited by examiner

*Primary Examiner*—Harry D. Wilkins, III
*Assistant Examiner*—Nicholas A. Smith
(74) *Attorney, Agent, or Firm*—Marshall, Gerstein & Borun LLP

(57) ABSTRACT

The invention provides a simple and convenient strategy for reducing the dimensions of organic micro- and nanostructures on metal surfaces. By varying electrochemical desorption conditions, organic structures patterned by Dip-Pen Nanolithography or any of the micro-contact printing procedures can be gradually desorbed in a controlled fashion. The electrochemical desorption is initiated at the exterior of the feature and moves inward as a function of time. The desorption process and adsorbate desorption are modified and controlled as a function of substrate morphology, adsorbate head and tail groups, and electrolyte solvent and salt. Different nanostructures made of different adsorbates can be miniaturized based upon judicious selection of adsorbate and supporting electrolyte.

38 Claims, 18 Drawing Sheets

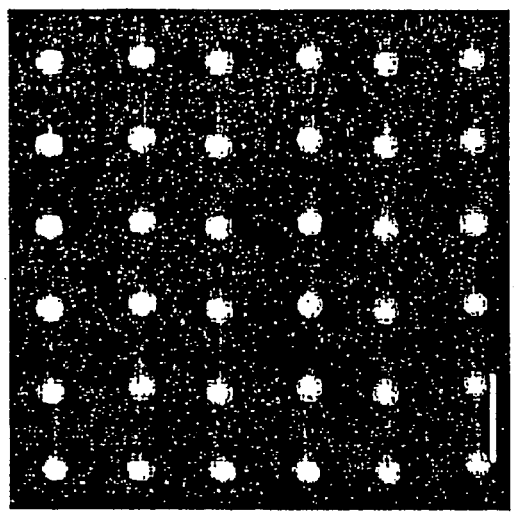
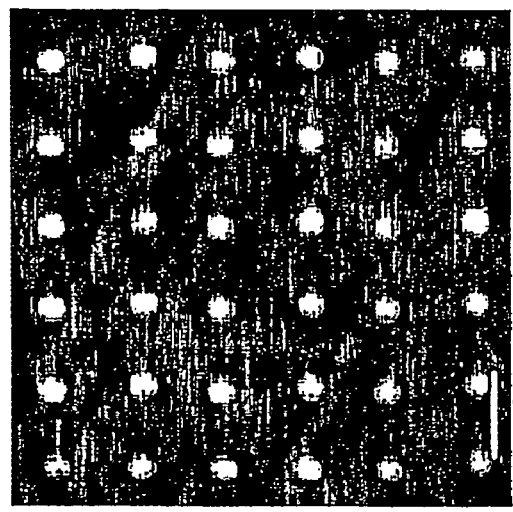
Fig. 8

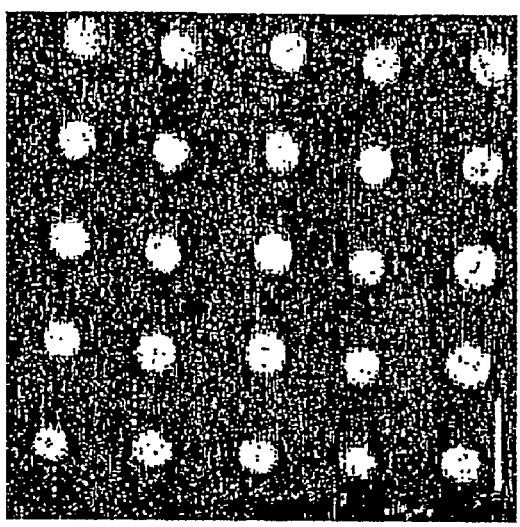
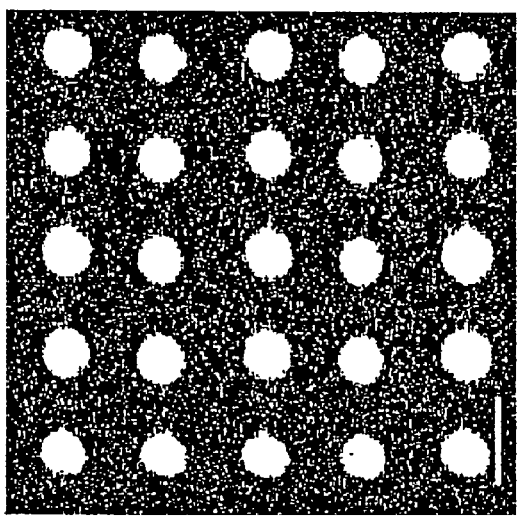
Fig. 9

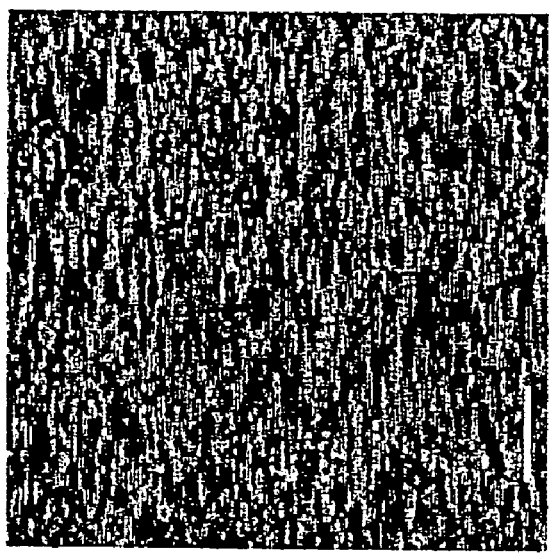
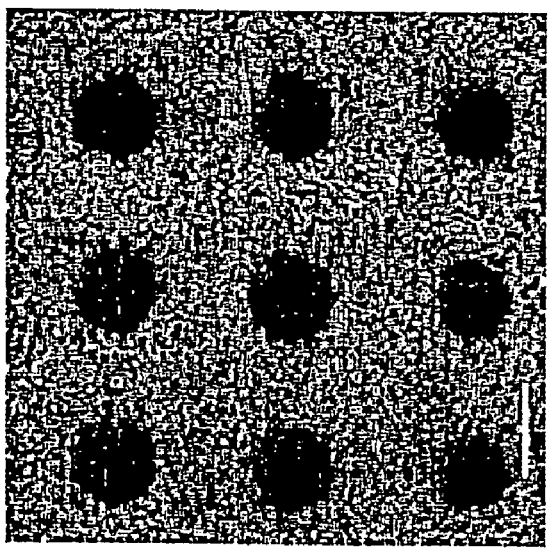
Fig. 10

ELECTROCHEMICAL MINIATURIZATION OF ORGANIC MICRO-AND NANOSTRUCTURES

CROSS REFERENCE TO RELATED APPLICATIONS

This application is the National Stage of International Application No. PCT/US03/2 1220 filed Jul. 7, 2003 which claims priority to U.S. Provisional Patent Application Serial No. 60/394,141, filed Jul. 5, 2002, entitled "Electrochemical Whittling of Organic Nanostructures," the disclosure of which is incorporated herein its entirety by this reference.

STATEMENT REGARDING FEDERALLY SPONSORED RESEARCH

This invention was made with Government support under Grant No. DAAD19-00-1-0414 awarded by DARPA, Grant No. DUIRINT F49620-01-l-0401 awarded by AFOSR and Grant No. NSEC EEC-0118025 awarded by the NSF. The Government has certain rights in this invention.

FIELD OF THE INVENTION

The invention lies in the field of forming and varying the size of organic microstructures and nanostructures.

BACKGROUND OF THE INVENTION

There are a variety of methods for printing and constructing organic structures on surfaces, and these methods are leading to significant advances in the understanding of the chemical consequences of miniaturization and the application of patterned surfaces in fields ranging from microbiology to electronics to catalysis. Micro-contact printing and variants of it are useful approaches for printing organic structures on surfaces because they are massively parallel and allow for the control of feature size, typically down to 200 nm. Among the scanning probe-based methods, Dip-Pen Nanolithography (DPN) has emerged as a powerful tool to do highly customized work in direct write fashion with a resolution that rivals electron beam lithography. Indeed, small organic molecules, oligonucleotides, proteins, conducting polymers and sol gels have all been patterned on inorganic substrates such as gold, silver, and silicon oxides with sub-50 nm resolution. Although advances have recently extended single-pen DPN approaches to parallel multi-pen approaches, the throughput of DPN cannot rival the available printing processes. Thus, an ideal method of forming organic nanostructures would have the high throughput of the printing processes but the resolution, alignment, registration and multi-ink capabilities of DPN.

One approach to fabricating highly miniaturized organic nanostructures is to controllably reduce the size of an existing organic structure. Previously, electrochemical methods have been used to effect the bulk desorption of adsorbates from self-assembled monolayers (SAM) coated on gold electrodes. It was proposed that the desorption process initiated from defect sites within the monolayers. It is also known that for materials in general, surface sites are typically more reactive than bulk sites.

Thus, there is a need for a method of reducing the size of an organic structure on a substrate by applying a potential in a controlled manner to selectively shrink features in a uniform manner at a controllable miniaturization rate.

SUMMARY OF THE INVENTION

The invention provides a method of miniaturizing the size of an organic structure on a substrate by applying an electrical potential to the substrate such that the organic structure is electrochemically desorbed from the outside of the organic structure towards the inside. Typically, the electrical potential applied is less than about −400 mV but greater than about −1500 mV. The electrical potential is applied in the presence of an electrolyte solution and the electrolyte may be an organic or inorganic molecule.

The method may be applied to organic structures that make contact with the substrate through atoms such as sulfur or selenium. The substrate is a conductive material that may be a polycrystalline metal, an ultra-flat single crystal metal or any conductive material to which the organic structures of interest will adsorb to such as gold. The organic structure may be fabricated on the substrate by any process.

Another embodiment of the present invention provides a method of miniaturizing the size of a first organic structure in the presence of a second organic structure on a substrate by applying an electrical potential to the substrate such that the first organic structure is electrochemically desorbed from the outside of the organic structure without negatively affecting the second organic structure. In this embodiment, the first organic structure may make contact with the substrate through a selenium atom and the second organic molecule may make contact with the substrate through a sulfur atom Additionally, in this embodiment, the first organic structure may contain a hexadecanoic acid tail group and the second organic molecule may contain an octadecane tail group.

Another embodiment of the present invention provides a method of miniaturizing the size of organic structures on a substrate by applying a first electrical potential to the substrate such that the first organic structure is electrochemically desorbed from the outside of the organic structure without negatively affecting the second organic structure and then applying a second electrical potential to the substrate such that the second organic structure is electrochemically desorbed from the outside of the organic structure without negatively affecting the first organic structure. The electrical potentials applied in this embodiment may be applied in the same or different electrolyte solutions. The method of this embodiment may also be used to form an organic structure on a conductive substrate by forming a first organic structure on a conductive substrate and forming at least one additional organic structure on the same conductive substrate. The first organic structure is then selectively removed or miniaturized leaving the additional organic structures on the substrate. This method may then be extended to incorporate another chemical onto the substrate in place of the first desorbed organic structure amongst the remaining additional organic structures.

BRIEF DESCRIPTION OF THE DRAWINGS

FIG. 8. Topography (A) and LFM images (B) of DPN-generated MHA pattern on Au(111) surface. The bar is 500 nm.

FIG. 9. LFM images of DPN-generated MHA pattern on Au (111) surface before (A) and after (B) electrochemical desorption at −750 mV for 2 min in 0.5 M aqueous KOH solution. The bar is 500 nm.

FIG. 10. LFM images of a DPN-generated 1-octadecanethiol (ODT) pattern before (A) and after (B) electrochemical desorption at −1000 mV for 5 min in 0.5 M aqueous KOH solution. The bar is 1 µm.

DETAILED DESCRIPTION OF THE INVETION

The present invention includes selectively shrinking the features of an organic structure in a uniform and controllable manner using electrochemical desorption. The technique reduces the size of an organic structure on a substrate through the application of a potential across the substrate. Surprisingly, it has been found that the organic structures are desorbed away from the perimeter of the structure inward, indicating that the free volume around the organic structure is essential to the electrochemical desorption process. Without intending to be bound by theory, it is believed that organic molecules at the edge of structure are less stable because there is greater accessibility of solvent molecules and ions to the electrode surface which facilitates the desorption process.

This method offers the possibility to shrink or "whittle" any structure composed of molecules that form close-packed nanostructures on conducting surfaces and is described in U.S. Provisional Patent Application Ser. No. 60/394,141, filed Jul. 5, 2002, entitled "Electrochemical Whittling of Organic Nanostructures," the disclosure of which is incorporated herein in its entirety by this reference. The rate and reduction in size can be controlled as a function of adsorbate head group, adsorbate tail group, solvent, electrolyte and substrate morphology. The organic structures to be miniaturized can be formed on the substrate by any application process including, but not limited to, Dip Pen Nanolithography (DPN), e-beam lithography, ion beam lithography, writing, stamping or any of the more parallel microcontact printing procedures.

The miniaturization method reduces the size of an organic structure on a substrate by applying an electrical potential to the substrate whereby the organic structure is selectively desorbed from the outside of the organic structure towards the inside thereby reducing the feature size. For example, by applying a negative potential to a gold electrode, patterned nanostructures of alkanethiol molecules on the surface of the electrode are gradually "whittled" by desorption and hence the feature size is reduced During this reductive-desorption process, the periphery of the nanostructures on the electrode surface undergoes the following reaction:

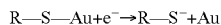

in which R is an organic molecule linked to the gold surface through a sulfur atom. It should be recognized, for example, that in the instance of an organic structure or nanostructure forming a pattern with an interior space, such as the outline of a square, the terms "outside" and "periphery" refer to the border between the substrate and the structure on the exterior of the outline as well as the border between the substrate and the structure on the interior space of the square.

Figure 2A:
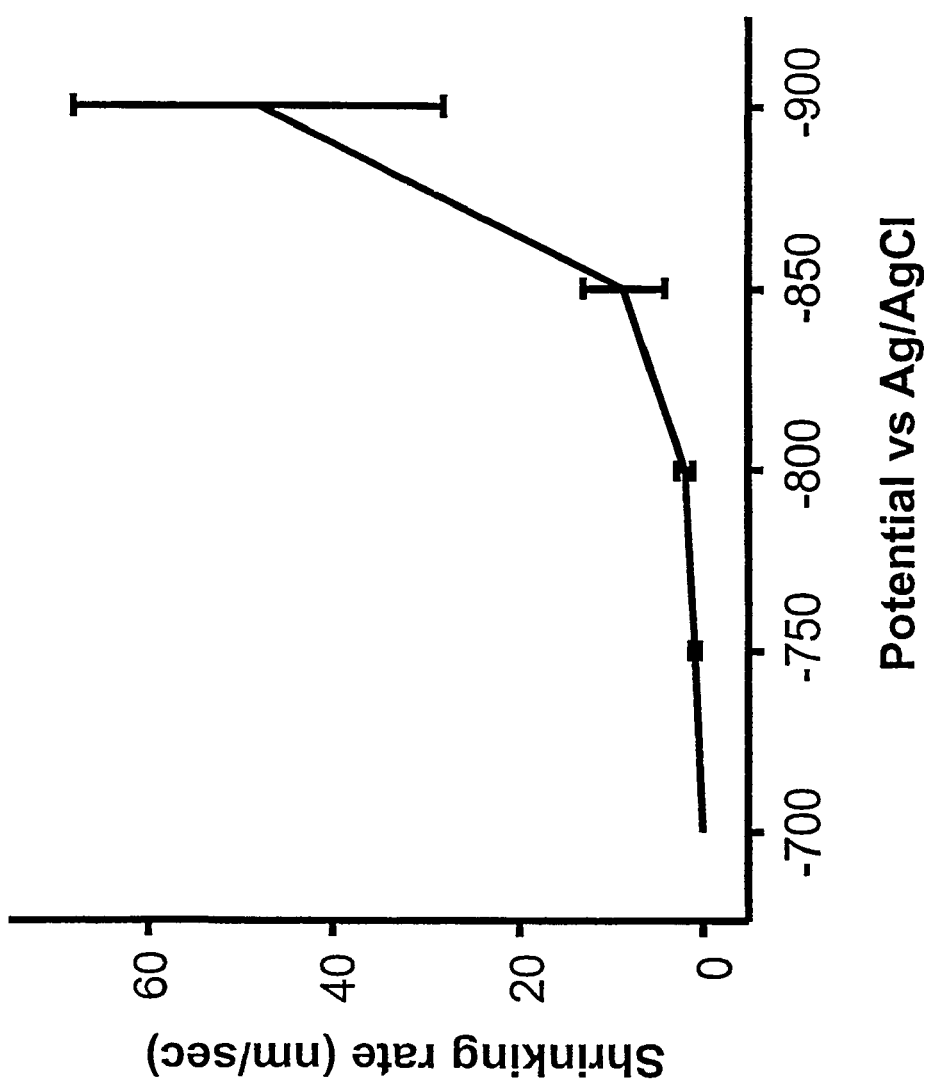
FIG. 2. A) A plot of electrochemical desorption rate (v) of MHA nanostructures as a function of the desorption potential. Data was averaged from three independent experiments, and in each experiment 9 MHA dots were measured before and after desorption. The desorption times applied at each potential were 120 sec (−700 mV), 120 sec (−750 mV), 30 sec (−800 mV), 10 sec (−850 mV), 2 sec (−900 mV) respectively. B) Exponential dependance of the average desorption rate (v) on the desorption potential.
Figure 2B:
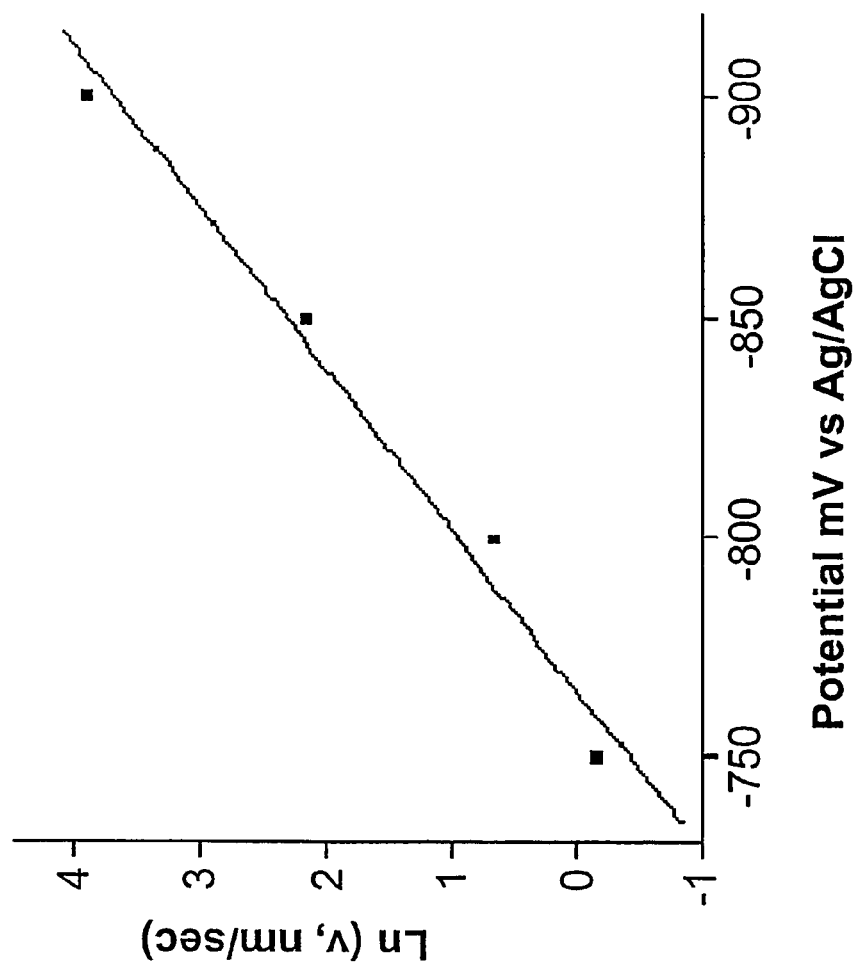

Because reductive desorption is a kinetic process that is strongly dependent upon the applied potential, the electrode potential used dramatically affects the desorption rate of the nanostructures. Thus, in one embodiment of the present invention, the desorption process can be controlled by varying the applied potential. The more negative the potential, the faster the rate of desorption. For example, as shown in FIG. 2, in 0.5 M aqueous KOH solution, the average desorption rate of MHA nanostructures is exponentially dependent upon the potential applied. At a potential of −700 mV applied for several minutes, no detectable desorption of the MHA nanostructures takes place. At a potential of −750 mV, the desorption rate is about 50 nm/min. Under a potential of −800 mV the desorption rate rises about 120 nm/min and under a potential of −900 mV, the desorption rate is about 3000 mm/min. Thus, the potential applied to MHA nanostructures is preferably less than about −700 mV. More preferably, the applied potential is less than about −750 mV. More preferably, the applied potential is between about −800 mV and about −1300 mV. Potentials below about −1500 mV can be used but the rate of desorption is so rapid that it becomes difficult to control the desorption and miniaturization of the patterned structure. A similar relationship is found for other organic molecules although the range of the potential applied will vary. The preferred range of potentials over which for any different organic molecule undergoes electrochemical desorption at a controllable rate is easily established by applying a relatively more positive potential of about −100 mV and steadily increasing the potential until the organic structure is completely desorbed. In general, the uniformity of the resulting features is better at slower desorption rates (i.e. desorption rates obtained at less negative electrode potentials). It should be recognized that at progressively more positive potentials, it is possible to completely remove the organic structures from the substrate. Thus, it is to be understood within the context of this disclosure and the claims, miniaturization or shrinking of an organic structure or structures includes, in the extreme, complete removal of the organic structure. Therefore, reference herein to "miniaturization" or "shrinking" of an organic structure is intended to include the process of removal of the organic structure by application of a sufficiently negative desorptive electrical potential.

One embodiment of the present invention is the process of modifying or controlling the reductive desorption of a substrate in an electrolyte solution by the use of solutions containing different electrolytes. A size-reduction phenomenon is observed when the desorption process is performed in either organic or inorganic electrolyte solutions, but the rate varies markedly depending upon the electrolyte used. For example, at an electrode potential of −750 mV, the average desorption rate in aqueous NaOH solution is approximately 16 nm/min, while in aqueous LiOH solution it is approximately 6 nm/min and in KOH solution it is approximately 50 nm/min. Thus, the desorption rates of structures in sodium or lithium-containing electrolyte solutions are much lower than in potassium-containing electrolyte solutions. Without intending to be bound by any one theory, it is believed that the slower desorption rate observed in the sodium or lithium electrolytes is due to the fact that the lithium ions ($Li^+$), and to a lesser extent, sodium ions ($Na^+$) are more strongly solvated in water so that the thick water shell around the lithium cations may hinder attack of the Au—S bond (the site of desorption) at the surface, thereby compensating the charge generated upon reduction and slowing the electrochemical desorption rate. In aqueous solutions, the preferred inorganic cations include lithium, potassium, cesium or sodium cations. Preferred organic cations are tetraalkylammonium-containing salts such as $(CH_3CH_2)_4N^+$ or $[CH_3(CH_2)_3]_4N^+$ formed in solution from compounds including, but not limited to, $(CH_3CH_2)_4NBF_4$, $(CH_3CH_2)_4NPF_6$, $[CH_3(CH_2)_3]_4NBF_4$ or $[CH_3(CH_2)_3]_4NPF_6$.

The desorption rate is also effected by the size of the cation. The electrochemical desorption of organic nanostructures in 0.1 M $(CH_3CH_2)_4NBF_4$ works effectively at a potential of between about −300 mV and about −400 mV vs Fc/Fc$^+$. However, the threshold potential for the desorption of organic nanostructures in 0.1 M $[CH_3(CH_2)_3]_4NBF_4$ solution is around −900 mV vs Fc/Fc$^+$ and the desorption process works well at more negative potentials of about −1270 mV. Thus, the electrochemical desorption process is highly dependent upon charge compensating cation size.

The electrochemical desorption of organic structures in organic solutions is not as controllable as in aqueous solutions, possibly because the organic structures are disordered by the organic solvent. As a result, inconsistent desorption rates under the same reductive potential is often observed. For example, the standard deviations in the electrochemical desorption rate in organic media can be orders of magnitude larger compared with those observed in aqueous media. For this reason, it is necessary to control the time of desorption carefully when a potential is applied in an organic solution to avoid complete desorption (i.e. loss) of the organic structure.

One embodiment of the present invention is the modulation of the desorption potential depending upon the head and tail group of the organic molecule forming the micro- or nanostructures. The necessary electrode potential and application time may vary widely in the desorption of nanostructures composed of different molecules. The difference is consistent with the reduction peak potentials observed for bulk monolayers. The more positive potential required to shrink octadecaneselenol (ODSe) nanostructures compared to the potential required for 1-octadecanethiol (ODT) nanostructures may be attributable to the weaker Au—Se bond compared to the Au—S bond. Organic molecules contacting the substrate through a selenium head group undergo electrochemical desorption over a range of potentials that varies depending on the organic molecule. For example, ODSe nanostructures can be controllably desorbed at a range of potentials from about −450 mV to about −900 mV, whereas ODT nanostructures require a more negative potential range of about −850 mV to about −1300 mV vs Ag/AgCl. That the electrochemical desorption of ODT nanostructures requires more negative potentials than those of MHA may be attributable to the lower solubility of ODT in aqueous electrolyte solutions.

Another embodiment of the present invention is the reductive desorption of organic structures formed on surfaces having different topographies. The topography of the surface on which the nanostructure is formed can effect the rate at which the desorption process takes place at the same relative potential. The more uniformly flat the surface, the slower and more uniform is the desorption of the organic structures formed on that surface. For example, the electrochemical desorption rate for organic structures formed on Au(111) substrates is lower than the rate observed for the same structures formed on polycrystalline Au substrates. This may result from the fact that organic molecules can form much more closely-packed and ordered organic structures with larger domain sizes on large single crystal terraces causing desorption to occur almost exclusively from the perimeter sites of each nanofeature. Such monolayers decrease the accessibility of solvent molecules and ions to the electrode surface, slowing the desorption process.

The electrochemical desorption method is extendable to organic structures fabricated by processes other than DPN. Thus, in one embodiment of the present invention, the reductive desorption is applied to organic structures fabricated on substrates by high-throughput techniques such as printing, stamping and photolithography to effectively shrink microstructures created by these processes to nanostructures. These printing processes can conveniently generate structures in parallel on the micrometer scale, however many of these techniques suffer technical difficulties in making organic nanostructures. It has also been difficult or expensive to directly fabricate organic nanostructures. Therefore, application of this electrochemical desorption process following the printing procedures improves the resolution of these high-throughput techniques and provides a means of taking a set of microscopic structures and transforming them into nanometer scale structures in a massively parallel fashion. Using this technique, organic structures can be reduced in diameter by an order of magnitude without causing distortion under optimized conditions.

Another embodiment of the present invention is the use of electrochemical desorption to selectively desorb specific organic structures from amongst many different organic structures fabricated on the same substrate. Through the use of organic structures having different head groups or different tail groups and the application of electrical potentials within a specific range, it is possible to miniaturize one organic structure without removing or adversely affecting other organic structures having different head groups. In this context, the organic structures that remain after one or more organic structures on a substrate are removed are identical to the original structure or are not adversely or negatively affected, meaning that these remaining structures retain their original functionality after the removal of the organic structure despite minor or insignificant changes.

For example, electrochemical desorption of a nanostructure composed of organic molecules with sulfur head groups (ODT) in an aqueous solution of 0.5 M KOH, begins at a potential of about −850 mV vs Ag/AgCl. Conversely, electrochemical desorption of a nanostructure composed of the same organic molecules with selenium head groups (ODSe) in an aqueous solution of 0.5 M KOH, is effective at a potential of about −450 mV vs Ag/AgCl. Thus, it is possible to create nanostructures composed of organic molecules having either sulfur or selenium headgroups on the surface of a conducting substrate by DPN or any of the printing processes and then selectively remove or miniaturize the selenium-containing organic structures without affecting the sulfur-containing organic structures by the application of an electrochemical potential in a range between about −450 mV and about −850 mV vs Ag/AgCl.

Modification of the tail group is another example of a change in the organic structure that can create a shift in the potential of the onset of electrochemical desorption thereby allowing the selective desorption of one organic structure from the surface of a substrate having multiple organic structures. For example, electrochemical desorption of a nanostructure composed of organic molecules having sulfur head groups with octadecane tail groups (ODT) in an aqueous solution of 0.5 M NaOH, begins at a potential of about −850 mV vs Ag/AgCl. Conversely, electrochemical desorption of a nanostructure having the same sulfur head group with hexadecanoic acid tail groups (MHA) in an aqueous solution of 0.5 M NaOH, is effective at a potential of about −750 mV vs Ag/AgCl. Similar to the exploitation of the difference in the onset of desorption amongst organic molecules with different head groups described above, it is also possible to create organic structures composed of organic molecules having hexadecanoic acid tail groups on the surface of a conducting substrate having organic structures composed of octadecane tail groups and selectively remove or miniaturize the hexadecanoic acid-containing organic structures without negatively affecting the octadecane-containing organic structures by the application of an electrochemical potential in a range between about −750 mV and about −800 mV vs Ag/AgCl.

Another variation on this embodiment of the present invention includes covering the entire exposed conducting surface of a substrate having one pre-patterned molecule with another organic molecule and selectively removing the pre-patterned molecule. This technique can also be used to produce readily functionalized nanoscale templates whereby the first pre-patterned organic structure is removed and then replaced with another molecule that will bind to the substrate. For example, by taking advantage of the difference in the onset of desorption potentials between thiol, and selenol terminated molecules, nanoscale regions of a conducting substrate can be exposed and subsequently functionalized with other materials and molecules.

Another method of miniaturizing one organic structure without negatively affecting other organic structures on the same substrate is through the selective use of different electrolyte solutions. For example, nanostructures composed of MHA in an aqueous solution of 0.5 M KOH begin to desorb at an electrochemical potential of about −750 mV vs Ag/AgCl. Conversely, those same nanostructures in a methylene chloride solution containing 0.1 M $(CH_3CH_2)_4NBF_4$ begin to desorb at an electrochemical potential of about −200 mV vs Fc/Fc+. Thus, by careful selection or changes made to the electrolyte solution it is possible to change the range over which a specific nanostructure will undergo the electrochemical desorption process. It is therefore possible to create differences in the desorption characteristics of different organic molecules such that a nanostructure created with one organic molecule can be selectively desorbed while a nanostructure composed of another organic molecule existing on the same substrate remains undisturbed.

Additional objects, advantages, and novel features of this invention will become apparent to those skilled in the art upon examination of the following examples thereof, which are not intended to be limiting.

EXAMPLES

These examples demonstrate the electrochemical desorption technique as a function of adsorbate head group, adsorbate tail group, solvent, electrolyte, and substrate morphology on organic structures generated by DPN as well as structures produced by the more parallel microcontact printing procedure.

Example 1

This example provides details of substrate preparation, DPN or microcontact printing of organic structures, and electrochemical whittling procedures. A polycrystalline Au film substrate was prepared by evaporating 10 nm of Ti (99.99%; Alfa Aesar, Ward Hill, Mass.) on $SiO_x$ followed by 60 nm of Au (99.99%; Alfa Aesar, Ward Hill, Mass.) in an evaporator chamber (Edwards Auto 306) at room temperature (Weinberger et al., *Adv. Mater.* 12:1600 (2000)). Au ball substrates were prepared from approximately 0.5 cm lengths of Au wire (99.99%, 0.5 mm in diameter; Alfa Aesar, Ward Hill, Mass.) by using a hydrogen/oxygen flame (Ross et al., *Langmuir* 9:632 (1993)).

DPN of organic nanostructures was performed using an atomic force microscope (AFM, CP, Veeco, Santa Barbara, Calif.) equipped with a 100 μm scanner with closed-loop scan control and commercial lithography software (DPNWrite™, DPN System-1, NanoInk Inc., Chicago, Ill.). Gold-coated $Si_3N_4$ AFM cantilevers (Microlever, Veeco, Santa Barbara, Calif.) with a spring constant of 0.05 N/m were used for patterning. MHA-coated tips were prepared by immersing the cantilevers in an acetonitrile solution saturated with 16-mercaptohexadecanoic acid (MHA) (90%; Fischer) for a few seconds, followed by blow drying the tips with compressed difluoroethane (Dust-off, Ted Pella Inc., Redding, Calif.). ODT-coated tips were prepared by thermal evaporation of 1-octadecanethiol (ODT) (98%; Fischer) onto the tips at 65° C. for 30 min. DODDSe-coated tips were also prepared by thermal evaporation of Dioctadecane diselenide (DODDSe) (synthesized according to Griffin et al., *J. Am. Chem. Soc.* 95:197 (1973)) onto the tips at 150° C. for one hour in an evacuated flask. All DPN patterning experiments were carried out under ambient laboratory conditions of approximately 30% relative humidity at about 20° C. Subsequent imaging of the generated patterns and the electrochemically-desorbed patterns was done using an AFM tip under conditions identical to those used for patterning.

MHA and ODT microstructure patters were also generated via micro-contact printing. Stamps were fabricated by placing a photolithographically-prepared master in a glass Petra dish, followed by pouring a mixture of polydimethlysiloxane (PDMS, Sylgard 184, Dow Corning, Midland, Mich.) in the ratio of 10:1 (v:v) monomer to initiator over the master. After one hour of degassing, the elastomer was cured for two hours at 60° C., and gently peeled from the master. The stamp was "inked" with 10 mM ethanol solution of ODT or MHA and dried with a $N_2$ flow. Organic microstructures were generated by bringing the stamp into contact with a clean Au substrate for about 3 seconds.

A substrate gold film or gold ball with pre-patterned organic structures was placed into the electrochemical cell and used as the working electrode in a three-electrode configuration (Bioanalytical System potentiostat, model BAS 100B). The counter electrode was a platinum wire, and all potentials were recorded with respect to an Ag/AgCl reference electrode. The electrochemical desorption was performed by applying a reductive potential to the substrate for a designated period of time. The cyclic voltammograms and differential-pulse-voltammogram (DPV) for the reductive desorption of MHA, ODT and octadecaneselenol (ODSe) self-assembled monolayers were also carried out using the same setup. 0.5 M aqueous solutions of KOH, LiOH and NaOH were used as the supporting electrolyte and were degassed with $N_2$ before use. Following the electrochemical desorption, the substrates were rinsed with nanopure water and ethanol, respectively, and then dried with $N_2$ gas. The patterned area of the surfaces was imaged again with the AFM, by making use of an alignment mark to measure the size change of the organic structures.

Electrochemical desorption of MHA nanostructures was also performed in an organic solvent. In this case, methylene chloride (99.9%; Fischer) containing 0.1 M $(CH_3CH_2)_4NBF_4$ or 0.1 M $[CH_3(CH_2)_3]_4NBF_4$ (99%; Aldrich) was used as the electrochemical solution. A polished silver fiber was used as reference electrode, which was calibrated with ferrocene.

Example 2

Figure 1:
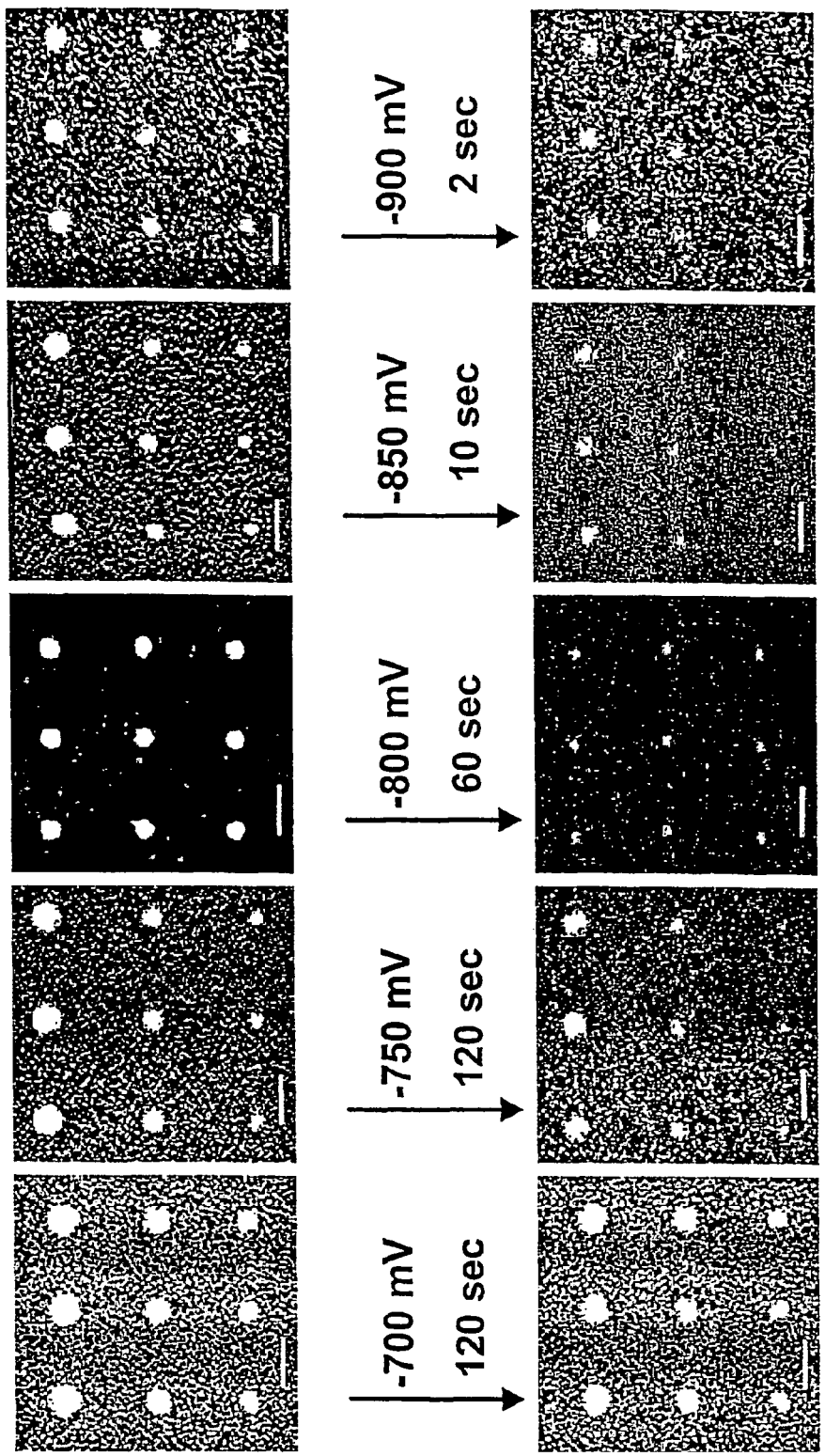
FIG. 1. Lateral Force Microscopy (LFM) images of DPN-generated 16-mercaptohexadecanoic acid (MHA) patterns before (upper) and after (below) electrochemical desorption at different potentials with different time lengths. The bar is 500 nm.

This example demonstrates the technique of electrochemical desorption on organic nanostructures using different electrochemical potentials. FIG. 1 shows the electrochemical desorption of MHA nanostructures at different potentials. A threshold voltage of about −750 mV vs Ag/AgCl was found, above which no desorption could be detected under our experimental conditions. As seen in FIG. 1, when the substrate was held at a potential of −700 mV in an aqueous solution of 0.5 M MOH (where M=K, Na or Li) for two minutes, the MHA dot size (approximately 300 nm) showed no detectable change. These results indicate that when a potential of −750 mV is applied to a substrate, the MHA dots begin to shrink at a rate of approximately 50 nm/min, see FIG. 1. Generally, more negative potentials accelerate feature size reduction. Under a potential of −800 mV, the desorption rate becomes approximately 120 nm/min. As the potential becomes more negative, the MHA dots shrink so fast that the desorption time is shortened to seconds. For example, the average dot diameter was reduced by approximately 100 nm when a potential of −850 mV was applied for 10 seconds, or a potential of −900 mV was applied for 2 sec (see FIG. 1I-1J). The average desorption rate (v) of the MHA dots under different potentials is summarized in FIG. 2 which shows an exponential dependance of the average desorption rate(v) on the applied potential.

Example 3

Figure 3:
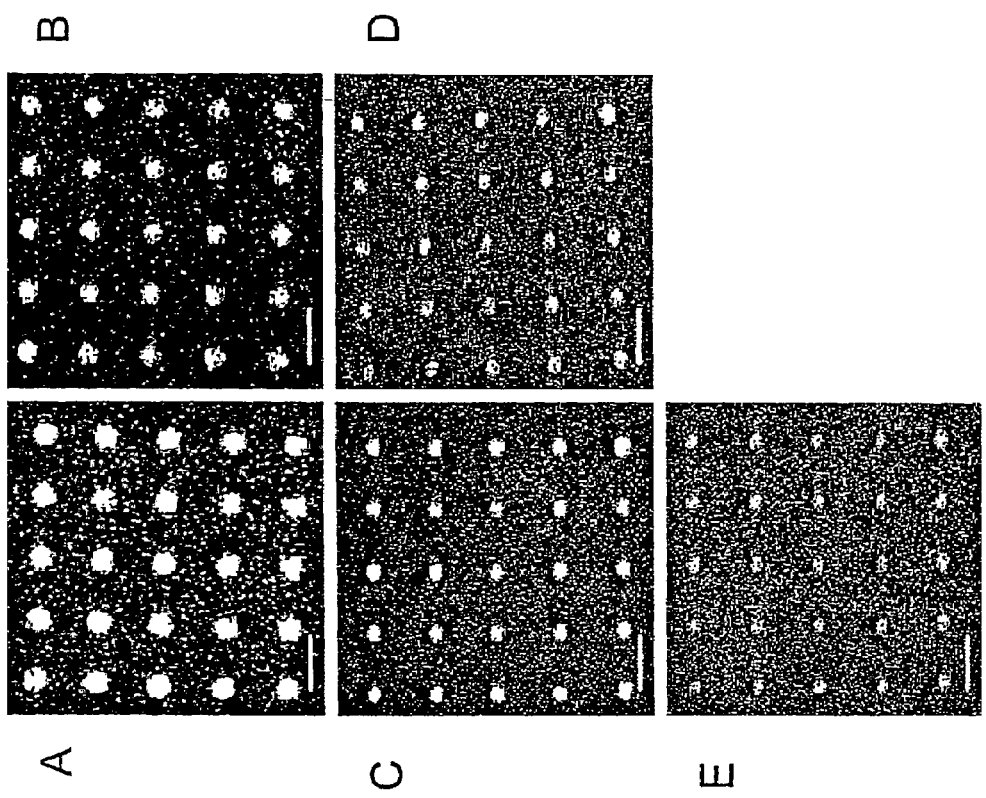
FIG. 3. LFM images of DPN-generated MHA patterns whittled in different electrochemical solutions at the electrode potential of −750 mV. A) A 5×6 array. B) The array in (A) after desorption in 0.5 M aqueous NaOH solution for 2 min. C) A 5×6 array. D, E) The array in (C) after desorption in 0.5 M aqueous LiOH solution for 2 min (D) and 4 min (E). The bar is 500 nm.
Figure 4:
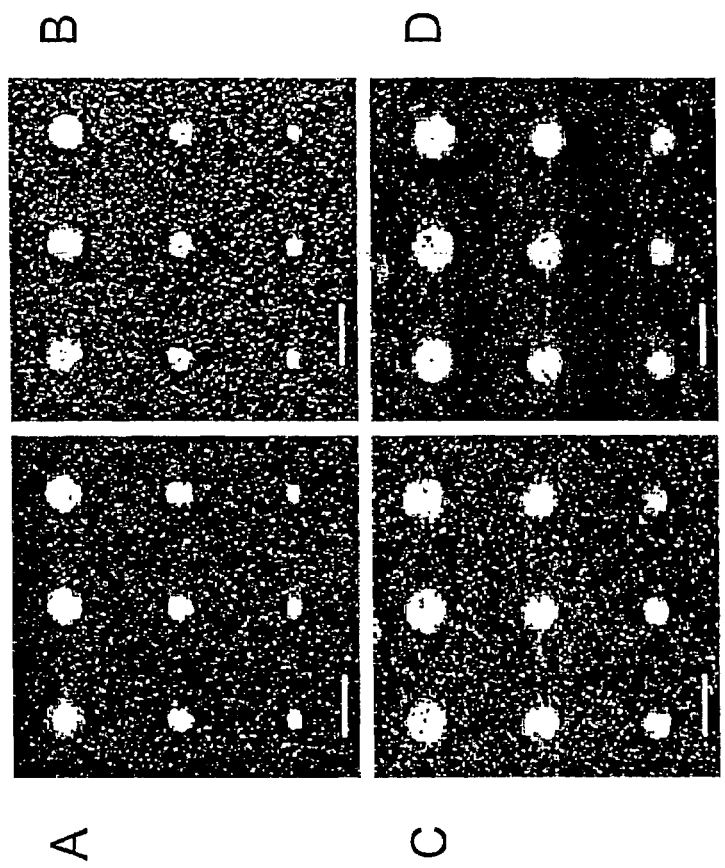
FIG. 4. LFM images of DPN-generated MHA patterns before (left) and after (right) electrochemical desorption. The electrode potential is −700 mV and the desorption time is 5 min. The electrochemical solutions are 0.5 M aqueous NaOH (A, B) and LiOH(C, D) solution respectively. The bar is 500 nm.

This example demonstrates the effect of electrochemical desorption on nanostructures in a variety of electrolytes. As shown in FIG. 3, when a potential of −750 mV vs Ag/AgCl is applied to the substrate, the MHA dots start to shrink in both NaOH and LiOH solutions. Again, no obvious size change was detected when the substrate potential was held at −700 mV or more positive for several minutes in both NaOH (compare FIGS. 4A and 4B) and LiOH (compare FIGS. 4C and 4D) solutions.

Figure 5:
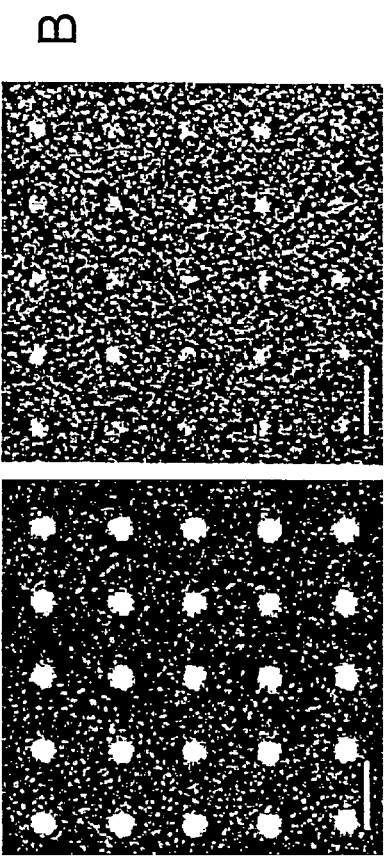
FIG. 5. LFM images of a DPN-generated MHA pattern before (A) and after (B) electrochemical desorption at −800 mV in 0.5 M aqueous LiOH solution for 2 min. The bar is 500 nm.

However, as shown in Table 1, the desorption rates of the MHA nanostructures in LiOH, NaOH, and KOH solutions were markedly different. At an electrode potential of −750 mV, the average desorption rate in 0.5 M aqueous NaOH solution was 16±7 nm/min, while in 0.5 M aqueous LiOH solution the desorption rate was 6±3 nm/min. The desorption rates in both NaOH and LiOH solutions are much lower than that in KOH solution. Although the desorption rate in LiOH solution was much slower, there was still a strong dependance on the applied potential. For example, in the case of a MHA array that consists of 200 nm average diameter dots, the desorption procedure at the potential of −800 mV for 2 min in 0.5 M aqueous LiOH solution results in an array consisting of nanostructures with average diameters of 110 nm (see FIGS. 5A and 5B).

TABLE 1

| Adsorbate | Electrolyte | Surface | Whittling Potential (mV) | Whittling Rate (nm/min) | Onset Potential (mV) |
|---|---|---|---|---|---|
| MHA | 0.5 M KOH aqueous solution | Polycrystalline Au | −750 (vs Ag/AgCl) | 50 ± 25 | −750 (vs Ag/AgCl) |
| MHA | 0.5 M NaOH aqueous solution | Polycrystalline Au | −750 (vs Ag/AgCl) | 16 ± 7 | −750 (vs Ag/AgCl) |
| MHA | 0.5 M LiOH aqueous solution | Polycrystalline Au | −750 (vs Ag/AgCl) | 6 ± 3 | −750 (vs Ag/AgCl) |
| MHA | 0.1 M $(CH_3CH_2)_4NBF_4$ in $CH_2Cl_2$ | Polycrystalline Au | −385 (vs Fc/Fc+) | 310 ± 290 | −200 (vs Fc/Fc+) |
| MHA | 0.1 M $[CH_3(CH_2)_3]_4NBF_4$ in $CH_2Cl_2$ | Polycrystalline Au | −1270 (vs Fc/Fc+) | 280 ± 170 | −900 (vs Fc/Fc+) |
| MHA | 0.5 M KOH aqueous solution | Au (111) | −750 (vs Ag/AgCl) | 35 ± 9 | −750 (vs Ag/AgCl) |
| ODSe | 0.5 M NaOH aqueous solution | Polycrystalline Au | −450 (vs Ag/AgCl) | 70 ± 36 | −450 (vs Ag/AgCl) |
| ODT | 0.5 M NaOH aqueous solution | Polycrystalline Au | −1000 (vs Ag/AgCl) | 96 ± 37 | −850 (vs Ag/AgCl) |

Figure 6:
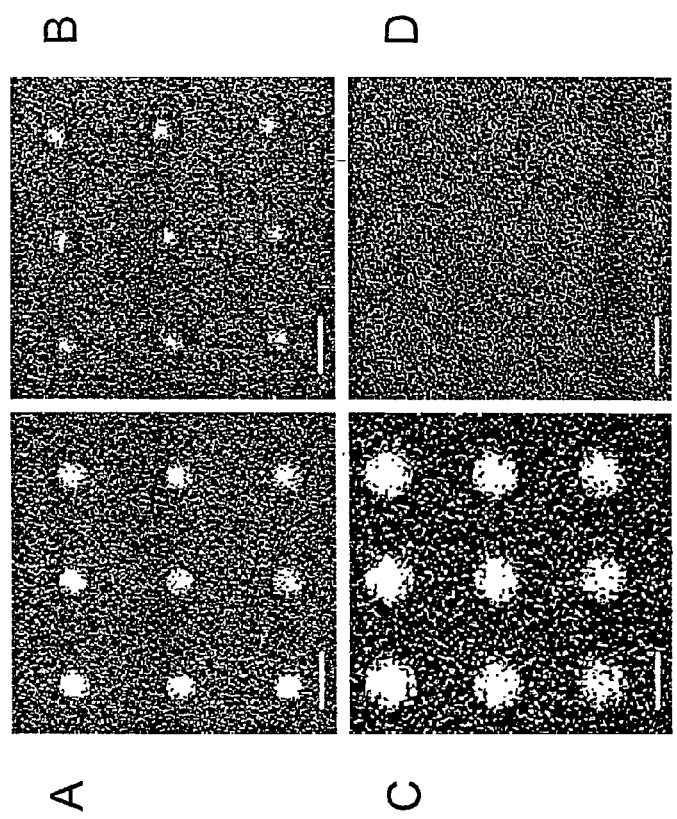
FIG. 6. LFM images of DPN-generated MHA patterns before and after electrochemical desorption in organic solutions. A) A 3×3 array. B) The array of (A) after desorption at −385 mV vs Fc/Fc$^+$ for 60 sec in 0.1 M $(CH_3CH_2)_4NBF_4$ methylene chloride solution. C) A 3×3 array. D) The same area in (C) after desorption at −460 mV vs Fc/Fc$^+$ for 60 sec in 0.1 M $(CH_3CH_2)_4NBF_4$ methylene chloride solution. The bar is 500 mm.
Figure 7:
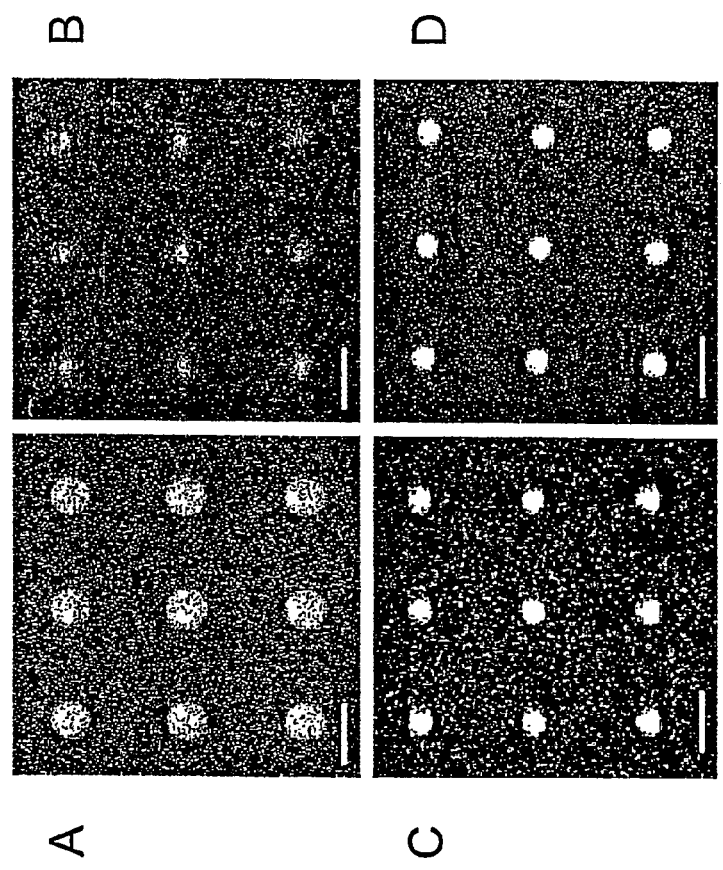
FIG. 7. LFM images of MHA patterns. A) 3×3 array. B) The array in (A) after desorption at −1270 mV vs Fc/Fc$^+$ for 60 sec in 0.1 M $[CH_3(CH_2)_3]_4NBF_4$ methylene chloride solution. C) A 3×3 array. D) The same array in (C) after desorption at −720 mV vs Fc/Fc$^+$ for 60 sec in 0.1 M $[CH_3(CH_2)_3]_4NBF_4$ methylene chloride solution. The bar is 1 µm.

To confirm the size effect of cations, electrochemical desorption was also performed in supporting electrolytes containing cations with different physical size. The experiments were carried out in methylene chloride solutions containing 0.1 M $(CH_3CH_2)_4NBF_4$ or 0.1 M $[CH_3(CH_2)_3]_4NBF_4$, by using a silver wire as the reference electrode and a platinum wire as the counter electrode. The results in Table 1 show that electrochemical desorption of MHA nanostructures in 0.1 M $(CH_3CH_2)_4NBF_4$, worked effectively at potential of about −300 to about −400 mV vs Fc/Fc$^+$. For example, referring to FIGS. 6A and 6B, 300 nm diameter MHA dots were reduced to approximately 200 nm after applying a potential of −385 mV vs Fc/Fc$^+$ for 1 minute. Applying a potential of −460 mV vs Fc/Fc$^+$ for 1 minute resulted in the removal of the MHA dots (approximately 450 nm) from the surface (FIG. 6C, 6D) of the substrate. However, the results indicate that the threshold potential for the desorption of MHA nanostructures in 0.1 M $[CH_3(CH_2)_3]_4NBF_4$ solution is around −900 mV vs Fc/Fc$^+$ and the desorption process works well at more negative potentials. As shown in FIGS. 7A and 7B, 680 nm diameter MHA dots were reduced to 350 nm after applying the potential of −1270 mV vs Fc/Fc$^+$ for 1 minute. By comparison, applying a potential of −720 mV vs Fc/Fc$^+$ for 1 minute resulted in no change of the MHA dot size (FIGS. 7C and 7D).

Example 4

This example demonstrates that electrochemical desorption can be used on a variety of organic structures. The versatility of the electrochemical desorption technique was shown by application to ODT and octadecaneselenol (ODSe) nanostructures that contain different tail ($CH_3$) or head (Se) groups. The different behaviors of these different organic molecules shows the complicated interactions between the organic structures and the environment. For example, features made from ODSe begin to shrink at −450 mV; 400 mv less negative than ODT (see Table 1).

Figure 11:
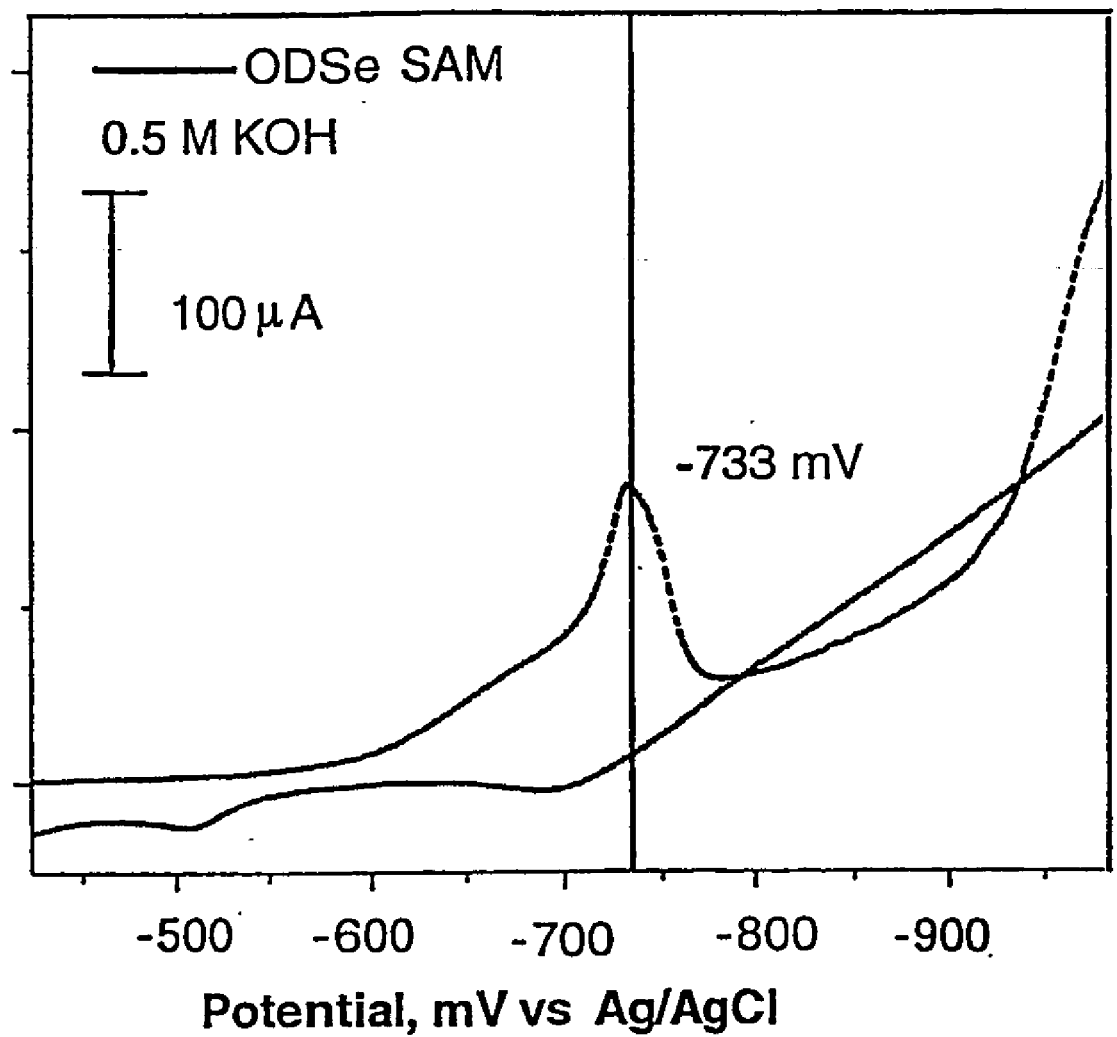
FIG. 11. Cyclic voltammogram for the reductive desorption of octadecaneselenol (ODSe) self-assembled monolayers on an Au substrate in 0.5 M aqueous KOH solution. The scan rate is 100 mV/sec.

In 0.5 M aqueous KOH solution, the reductive desorption peak in the cyclic voltammetry of a bulk self-assembled monolayer of ODT on a gold electrode is centered at around −1150 mV vs Ag/AgCl. Electrochemical desorption of ODT nanostructures was found to begin at a potential of about −850 mV and to work well under an electrode potential of −1000 mV in 0.5 M KOH solution. For example, after desorption at about −1000 mV for about 5 min, 900 nm ODT dots (FIG. 10A) were significantly reduced to approximately 320 nm structures (see FIGS. 10A and 10B). Dioctadecane diselenide (DODDSe) molecules react with Au atoms and form close-packed octadecaneselenol (ODSe) monolayers. In contrast bulk experiments indicated the reduction peak in the cyclic voltammetry of an ODSe self-assembled monolayer on a gold electrode in 0.5 M aqueous KOH solution is centered at about −730 mV (see FIG. 11A). FIGS. 11B and 11C show an ODSe dot array before and after desorption respectively indicating an average of about 60 nm reduction in the dot size after desorption at about −450 mV for 1 minute.

Example 5

Figure 13:
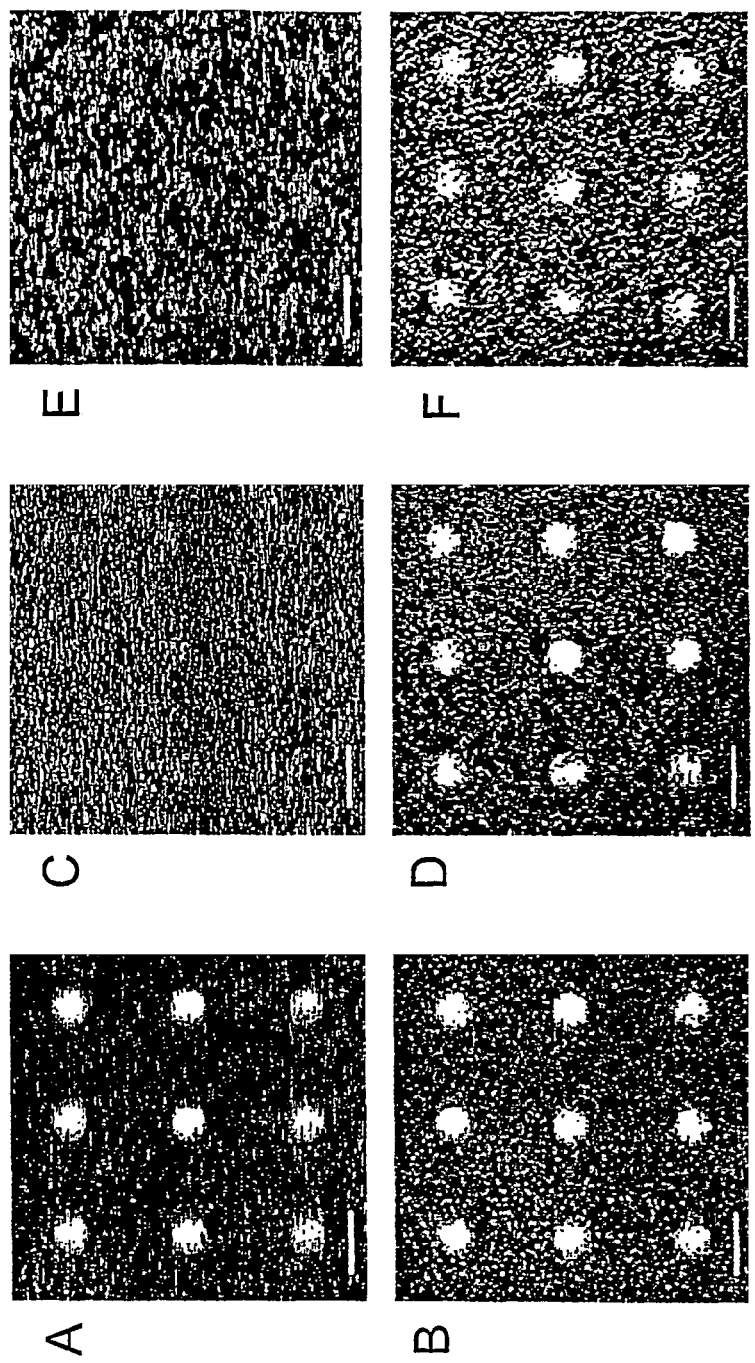
FIG. 13. Topography (A, C, E) and LFM (B, D, F) images of a DPN-generated MHA dot array. A, B) Original MHA array. C, D) The same array in (A) and (B) after ODT passivation. E, F) The same array in (C) and (D) after electrochemical desorption at −750 mV for 5 min in KOH solution. The bar is 500 nm.

This example demonstrates that the free volume around organic structures causes the desorption of the organic structures from the less-dense periphery of the structures towards the dense interior of the structure during the electrochemical desorption process. Organic nanostructures are "whittled" away from the perimeter of the structure inward because organic molecules at the edge of nanostructures are less stable and because the perimeter is more permeable to electrolyte molecules. If the perimeter of nanostructures is filled with other molecules, the desorption is rendered ineffective. This was demonstrated by the unsuccessful desorption of ODT-passivated MHA nanostructures. FIGS. 13A and 13B show approximately 300 nm MHA nanostructures generated on a gold substrate. The substrate was passivated with 5 mM ODT in ethanol solution for 1 minute and washed with ethanol (see FIGS. 13C and 13D). A potential of −750 mV was applied to the substrate for 5 min in 0.5 M aqueous KOH solution (see FIGS. 13E and F). LFM images indicate almost no change in the feature size of the MHA dots before and after desorption (compare FIGS. 13B, 13D and 13F). In topography images, the original dots had an average height of approximately 2 nm (see FIG. 13A) which was reduced relative to the ODT-covered surface after passivation (see FIG. 13C), and this situation remained unchanged even after the performance of the electrochemical desorption (see FIG. 13E).

Example 6

This example desmonstrates the effect of different surface topographies of the metal substrate on the electrochemical desorption of organic nanostructures. Compared with polycrystalline gold film prepared by thermal evaporation, a hydrogen/oxygen flame-annealed Au ball offers large atomically flat facets. DPN can generate pseudo-crystalline monolayers and form uniform nanostructures on such a flat surface. As shown in FIGS. 8A and 8B, in the topography image the atomic steps on the Au surface are visible, while in the LFM image the surface background is very uniform.

The electrochemical desorption of organic nanostructures on such flat surfaces behaves more ideally. The results indicate that the electrochemical desorption of MHA nanostructures on a Au (111) surface is more uniform and slightly slower than that on polycrystalline Au surface. In a typical experiment, MHA dots of approximately 300 nm formed on a Au(111) substrate were reduced to approximately 230 nm structures (see FIGS. 9A and 9B) by applying a potential of −750 mV for 2 minutes in 0.5 M aqueous KOH solution. Moreover, after electrochemical whittling the peripheries of the MHA dots are very uniform, a consequence of uniform desorption from the edges of the features inward. These results show that at an electrode potential of −750 mV in 0.5 M aqueous KOH solution the desorption rate is 35±9 nm/min. Note that the standard deviation is only about 25% of the average desorption rate compared to about 50% of that on a polycrystalline Au surface. Moreover after electrochemical desorption, the periphery of the MHA dot is very smooth, indicating a uniform size-reduction process initiated from the edge inward. Additionally, holding the electrode at −700 mV in KOH solution for several minutes shows no detectable size reduction, similar to that on a polycrystalline Au surface.

Example 7

Figure 12:
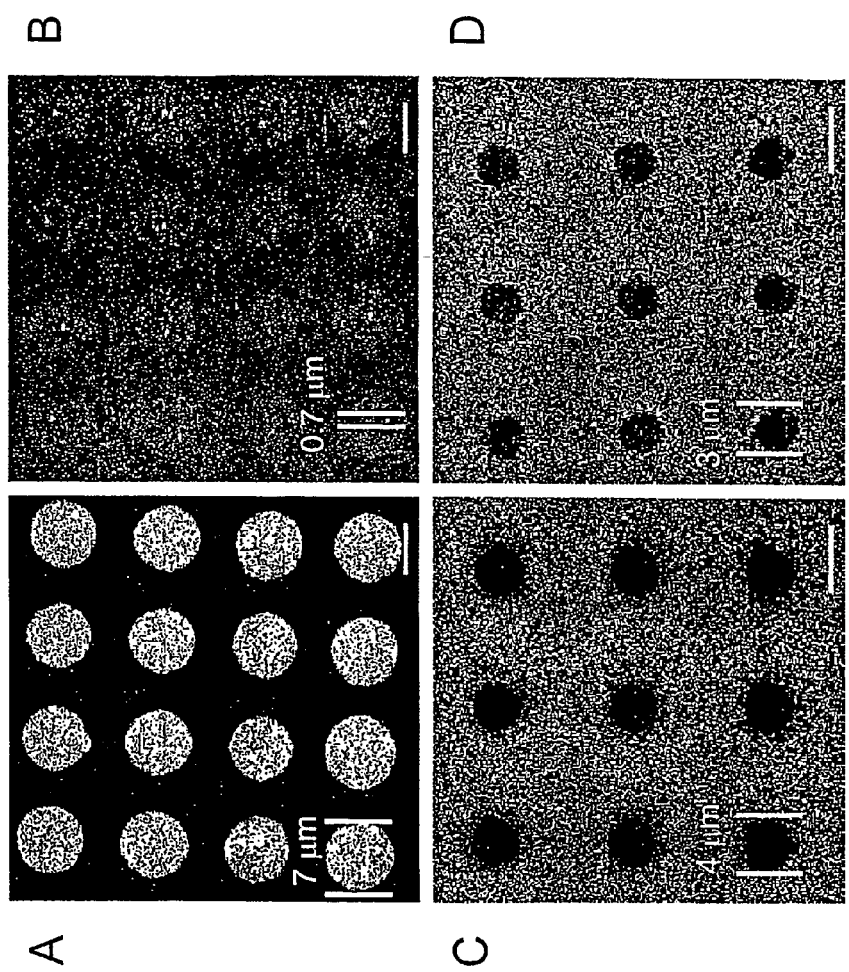
FIG. 12. LFM images of micro-contact printing-generated patterns before and after electrochemical desorption. A) Original MHA dots array. B) The MHA dot array in the same area as in (A) after electrochemical desorption at a potential of −920 mV for 30 sec in 0.5 M KOH solution. C) Original ODT dot array. D) The ODT dot array in the same area as in (C) after electrochemical desorption at a potential of −1100 mV for 5 min in 0.5 M KOH solution. The bar is 5 µm.

This example demonstrates that electrochemical desorption can effect parallel size reduction of organic microstructures fabricated by parallel processes. FIG. 12 shows the electrochemical desorption of MHA microstructures generated by the micro-contact printing method. The original MHA structures have an average feature size of approximately 7 μm (FIG. 12A). This average feature size was reduced to approximately 0.7 μm after applying a potential of −920 mV vs Ag/AgCl for 30 seconds in 0.5 M KOH aqueous solution (see FIG. 12B). Micro-contact printing patterns of ODT were also desorbed using the same method (see FIGS. 12C and 12D). After desorption at −1100 mV vs Ag/AgCl for 5 minutes in 0.5 M KOH aqueous solution, ODT microstructures having a feature size of about 4 μm (FIG. 12C) were reduced to microstructures having a feature size of about 3 μm (see FIG. 12D). Thus, it is generally possible to shrink a structure by an order of magnitude in diameter without significantly distorting the features.

Figure 14:
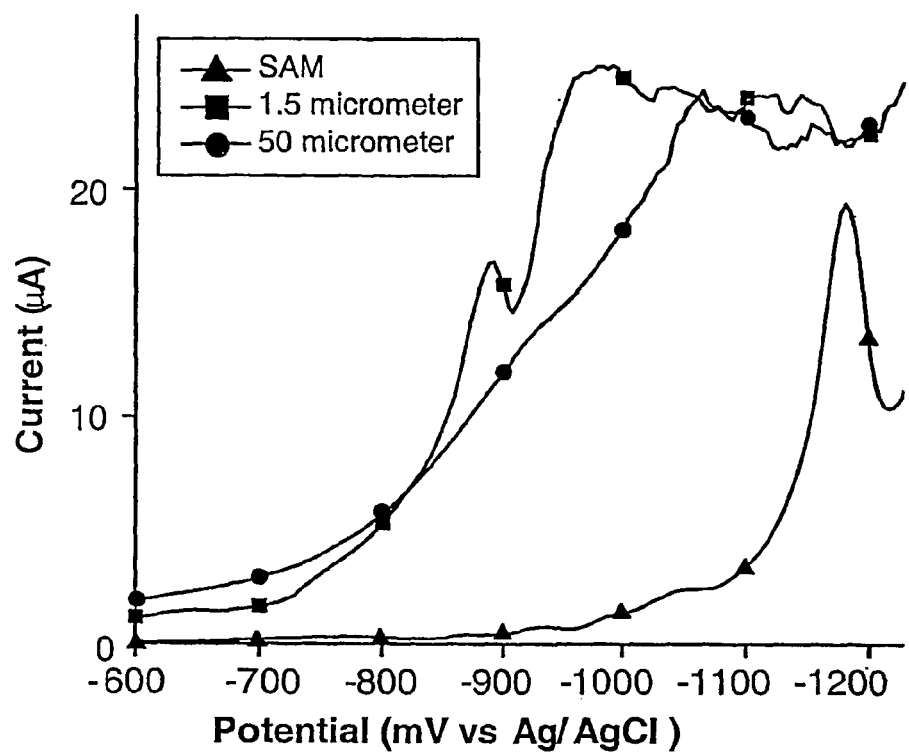
FIG. 14. Typical differential-pulse Voltammogram (DPV) of ODT SAMs and stamped ODT patterns with different feature size, 1.5 µm and 50 µm, respectively. DPVs were carried out in 0.5 M aqueous KOH solution with Ag/AgCl and Pt wire as reference and courter electrodes, respectively. Pulse period, 200 ms; pulse amplitude, 50 mV; pulse width, 50 ms; scan rate, 20 mV/s.

Experiments on reductive desoprtion of micro-contact printed patterns also indicate the presence of an edge effect. As shown in FIG. 14, stamped ODT patterns with different feature sizes have different behavior in Differential-pulse Voltammogram (DPV). In the case of ODT patterns with small feature sizes (1.5 μm), the current increases quickly from about −800 mV to about −900 mV because of the large number of molecules located at the edge area. Besides a broad peak at about −1000 mV, a small shoulder peak around −890 mV is often observed. However, in the case of ODT patterns with a feature size of 50 μm, there is only a broad peak at the more negative potentials compared with those of the 1.5 μm ODT patterns.

Example 8

Figure 15:
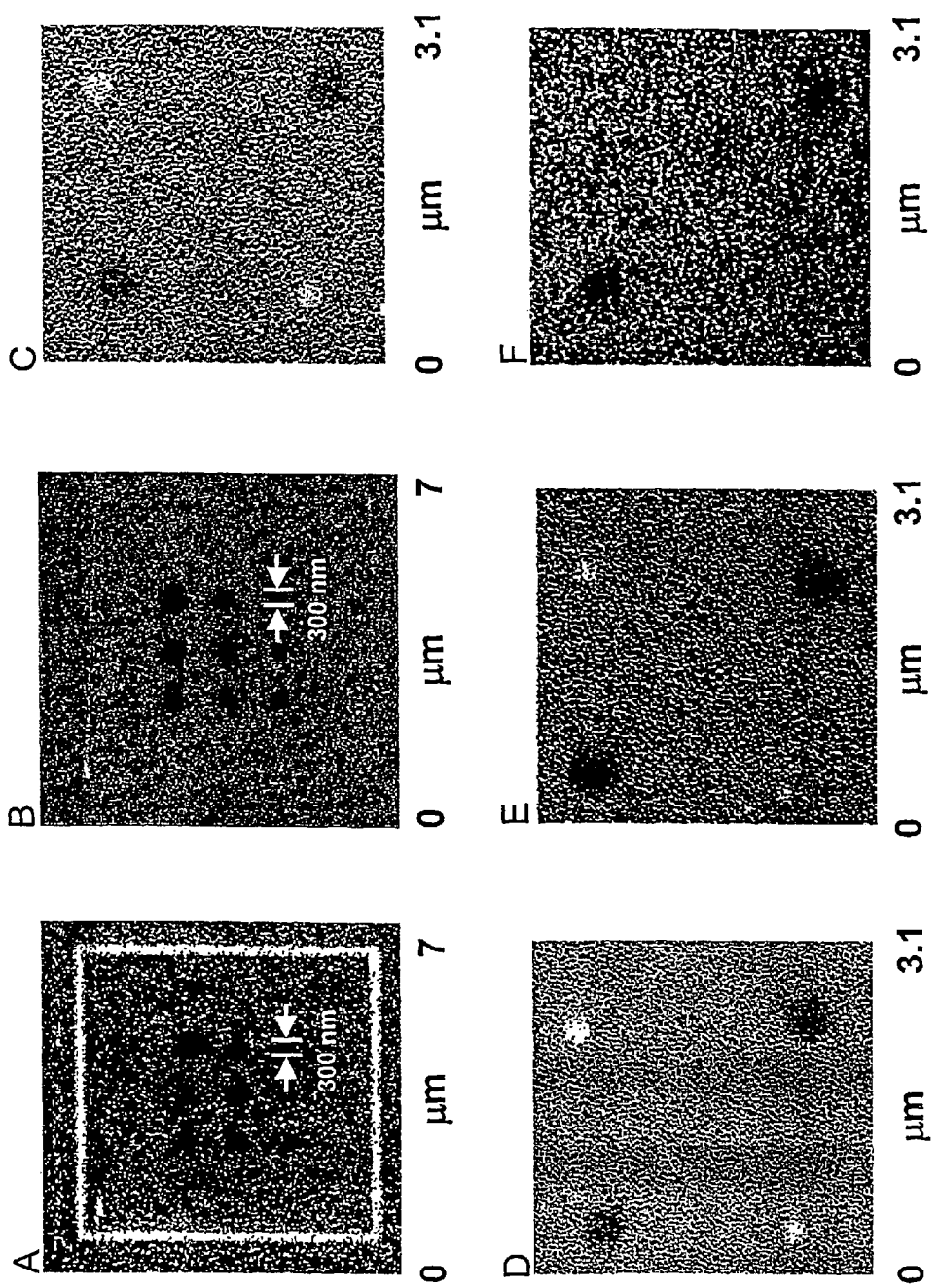
FIG. 15. LFM images of MHA and ODT patterns before and after selective desorption. A) 3×3 ODT dot array "framed" by MHA lines. B) The array in (A) after applying a potential of −750 mV for 5 min. C) 2×2 array of MHA and ODT dots. D) Array in (C) after applying a potential of −750 mV for 1 min. E) Array in (D) after applying a potential of −750 mV for 2 min. F) Array in (E) after applying a potential of −750 mV for 3 min.

This example demonstrates the selective desorption of one organic structure without negatively affecting other organic structures present on the same substrate. This was first shown with organic molecules having the same head group and different tail groups. Referring to FIG. 15, a 3×3 ODT dot array was "framed" with MHA lines on a conductive substrate. The MHA lines were selectively desorbed from the substrate without significantly affecting the ODT array by the application of a potential of −750 mV for 5 minutes. Similarly, a 2×2 array of MHA and ODT dots was patterned on the same conductive substrate (FIG. 15C). A potential of −750 mV was applied for intervals of 1 minute, 3 minutes and 6 minutes (FIGS. 15D, E and F respectively). The MHA dots were progressively desorbed and finally removed from the substrate without significant desorption of the ODT dots.

Figure 16:
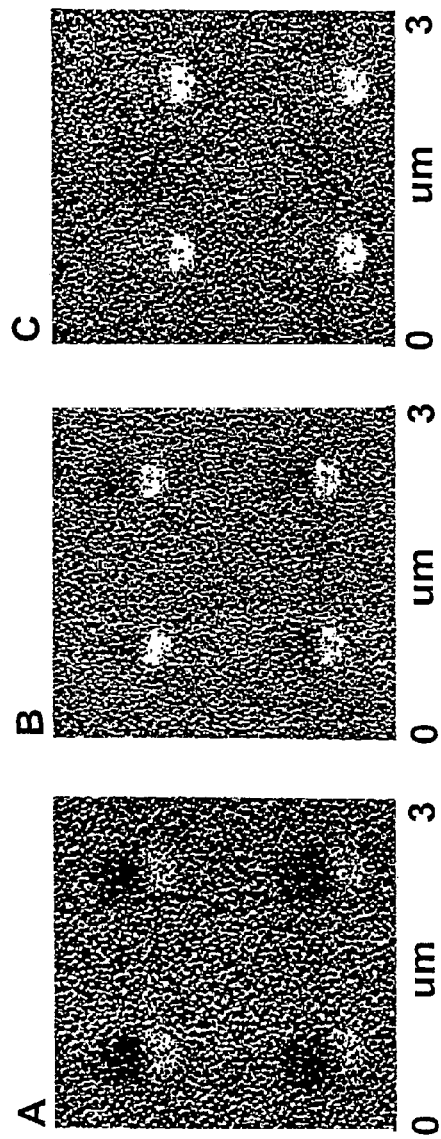
FIG. 16. A) LFM images of an array of 2×2 MHA dots and 2×2 ODSe dots in close proximity. B) Array in (A) after applying a potential of −450 mV for 2 min. C) Array in (B) after applying a potential of −500 mV for 2 min.

This selective desorption was next shown with organic molecules having different head groups. Referring to FIG. 16, an array of 2×2 MHA dots and 2×2 ODSe dots were created in close proximity on the same conductive substrate. A reductive potential of −450 mV or −500 mV (FIGS. 16B and C respectively) was applied to the substrate for 2 minutes without significant desorption of the MHA dots.

Figure 17:
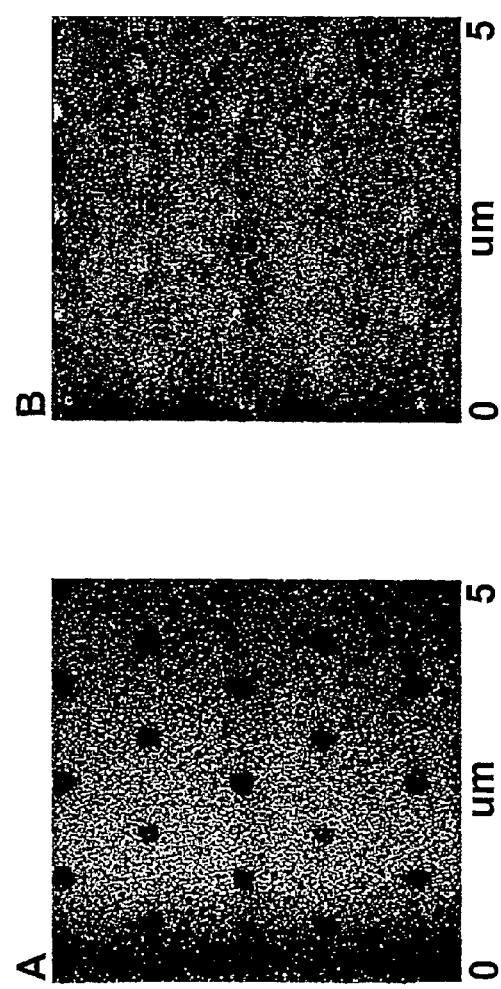
FIG. 17. LFM images of an ODSe dot array before and after selective desorption. A) ODSe dot array with an average dot diameter of 500 nm. (B) Array in (A) after passivation in a 1 mM ODT solution for 1 min then applying a potential of −800 mV for 2 min.

The creation of specific features in a first organic structure by the selective desorption of a second organic structure from within the first organic structure was shown by the removal of an ODSe dot array from an ODT structure. Referring to FIG. 17, an ODSe dot array with an average dot diameter of 500 nm was created on a conductive substrate (FIG. 17A) which was then passivated in a 1 mM ODT solution for 1 minute. A potential of −800 mV for 2 minutes was applied to the substrate resulting in substantively removing the ODSe dots from within the ODT monolayer to leave on ODT monolayer with openings where another organic structure had been reductively desorbed (FIG. 17B).

Figure 18:
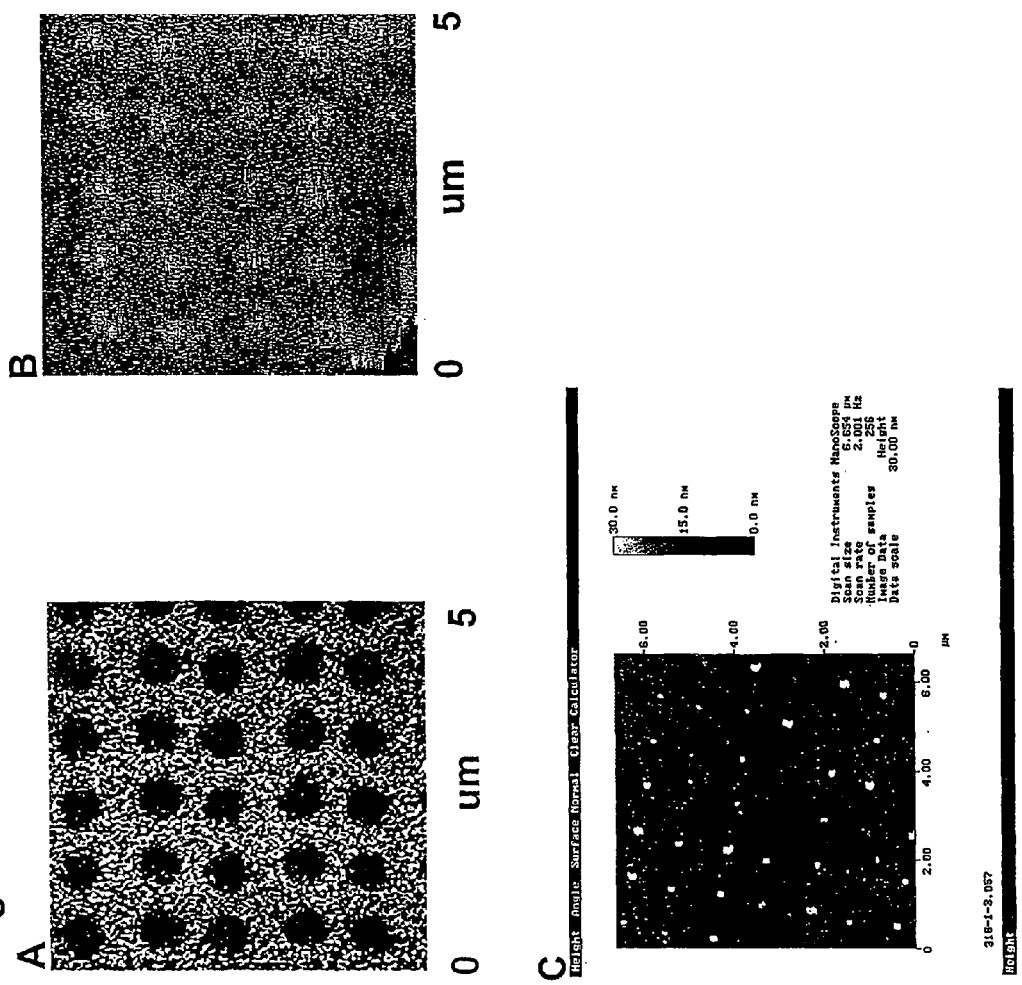
FIG. 18. Using selective whittling to generate nanoscale templates. A) LFM image of ODSe dot array. B) Array in (A) after passivating in a 1 mM ODT solution for 1 minute followed by application of a potential of −800 mV for 2 min. C) Non-contact mode image of the array in (B) after immersing substrate in 1 mM 1,6-hexanedithiol solution followed by incubation in a 13 nm colloidal gold solution.

The functionalization of a gold surface was demonstrated by forming an ODSe dot array on a substrate (FIG. 18A) followed by passivation in 1 mM ODT solution for 1 minute. A potential of −800 mV was applied to the substrate for 2 minutes (FIG. 18B) followed by immersion of the substrate in 1 mM 1,6-hexanedithiol solution for 5 minutes followed by incubation in a 13 nm colloidal gold solution. The resulting non-contact mode (NCM) images show that Au nanoparticles selectively attached to the exposed thiol regions (FIG. 18C).

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A method of miniaturizing the size of an organic structure on a substrate comprising applying an electrical potential to the substrate whereby the organic structure is electrochemically desorbed from the outside of the organic structure.

2. The method of claim 1, wherein the electrical potential is less than about −400 mV.

3. The method of claim 1, wherein the electrical potential is between about −400 mV and about −1500 mV.

4. The method of claim 1, wherein the electrical potential is applied in the presence of a solution.

5. The method of claim 1, wherein the electrical potential is applied in the presence of an electrolyte.

6. The method of claim 5, wherein the electrolyte is an inorganic molecule.

7. The method of claim 6, wherein the electrolyte is selected from the group consisting of $Li^+$, $Cs^+$, $Na^+$ and $K^+$ cations.

8. The method of claim 5, wherein the electrolyte is an organic molecule.

9. The method of claim 8, wherein the electrolyte is a tetraalkylammonium cation.

10. The method of claim 9, wherein the tetraalkylammonium cation is at least one of $(CH_3CH_2)_4N^+$ and $[CH_3(CH_2)_3]_4N^+$.

11. The method of claim 1, wherein the organic structure makes contact with the substrate through a sulfur atom.

12. The method of claim 1, wherein the organic structure makes contact with the substrate through a selenium atom.

13. The method of claim 1, wherein the substrate is a polycrystalline metal.

14. The method of claim 1, wherein the substrate is an ultra-flat single crystal metal.

15. The method of claim 1, wherein the substrate is gold.

16. A method of miniaturizing the size of an organic structure fabricated on a substrate by process selected from the group consisting of Dip Pen Nanolithography, printing, stamping, photolithography and combinations thereof, comprising applying an electrical potential to the substrate whereby the organic structure is electrochemically desorbed from the outside of the organic structure.

17. The method of claim 16, wherein the electrical potential is less than about −400 mV.

18. The method of claim 16, wherein the electrical potential is between about −400 mV and about −1500 mV.

19. The method of claim 16, wherein the electrical potential is applied in the presence of a solution.

20. The method of claim 16, wherein the electrical potential is applied in the presence of an electrolyte.

21. The method of claim 20, wherein the electrolyte is an inorganic molecule.

22. The method of claim 21, wherein the electrolyte is selected from the group consisting of $Li^+$, $Cs^+$, $Na^+$ and $K^+$ cations.

23. The method of claim 20, wherein the electrolyte is an organic molecule.

24. The method of claim 23, wherein the electrolyte is a tetraalkylammonium cation.

25. The method of claim 24, wherein the tetraalkylammonium cation is at least one of $(CH_3CH_2)_4N^+$ and $[CH_3(CH_2)_3]_4N^+$.

26. The method of claim 16, wherein the organic structure makes contact with the substrate through a sulfur atom.

27. The method of claim 16, wherein the organic structure makes contact with the substrate through a selenium atom.

28. The method of claim 16, wherein the substrate is a polycrystalline metal.

29. The method of claim 16, wherein the substrate is an ultra-flat single crystal metal.

30. The method of claim 16, wherein the substrate is gold.

31. The method of claim 16, wherein molecules forming the organic structures are selected from the group consisting of 16-mercaptohexadecanoic acid, 1-octadecanethiol, octadecaneselenol and combinations thereof.

32. A method of miniaturizing the size of a first organic structure in the presence of a second organic structure on a substrate comprising applying an electrical potential to the substrate whereby the first organic structure is electrochemically desorbed from the outside of the organic structure without negatively affecting the second organic structure.

33. The method of claim 32, wherein the first organic structure makes contact with the substrate through a selenium atom and the second organic molecule makes contact with the substrate through a sulfur atom.

34. The method of claim 32, wherein the first organic structure comprises a hexadecanoic acid tail group and the second organic molecule comprises an octadecane tail group.

35. A method of miniaturizing the size of organic structures on a substrate comprising:
   a. applying a first electrical potential to the substrate whereby a first organic structure is electrochemically desorbed from the outside of the organic structure without negatively affecting a second organic structure; and,
   b. applying a second electrical potential to the substrate whereby a second organic structure is electrochemically desorbed from the outside of the organic structure without negatively affecting the first organic structure.

36. The method of claim 35, wherein the first applying step (a) is conducted in a first electrolyte solution and wherein the second applying step (b) is conducted in a second electrolyte solution.

37. A method of forming organic structures on a conductive substrate comprising:
   a. forming a first organic structure on a conductive substrate;
   b. forming at least one additional organic structure on the conductive substrate; and,
   c. applying an electrochemical potential to the substrate whereby the first organic structure is desorbed to form an organic structure comprising the at least one additional organic structure on the conductive substrate.

38. A method of forming organic structures on a conductive substrate comprising:
   a. forming a first organic structure on a conductive substrate in a first position;
   b. forming at least one additional organic structure on the conductive substrate in at least one second position;
   c. applying an electrochemical potential to the substrate whereby the first organic structure is desorbed;
   d. contacting the conductive substrate with a molecule that will adhere to the surface of the substrate to form an organic structure comprising the at least one additional organic structure in the at least one second position and the molecule that will adhere to the surface of the substrate in the first position on the conductive substrate.

* * * * *

UNITED STATES PATENT AND TRADEMARK OFFICE
CERTIFICATE OF CORRECTION

PATENT NO. : 7,611,619 B2
APPLICATION NO. : 10/520554
DATED : November 3, 2009
INVENTOR(S) : Mirkin et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1080 days.

Signed and Sealed this

Fourteenth Day of December, 2010

David J. Kappos
*Director of the United States Patent and Trademark Office*